(12) United States Patent
Seok

(10) Patent No.: US 7,635,644 B2
(45) Date of Patent: Dec. 22, 2009

(54) SEMICONDUCTOR DEVICE INCLUDING METAL INTERCONNECTION AND METHOD FOR FORMING METAL INTERCONNECTION

(75) Inventor: Ka Moon Seok, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 90 days.

(21) Appl. No.: 11/544,756

(22) Filed: Oct. 10, 2006

(65) Prior Publication Data

US 2007/0080459 A1    Apr. 12, 2007

(30) Foreign Application Priority Data

Oct. 10, 2005  (KR)  ............. 10-2005-0094956

(51) Int. Cl.
*H01L 21/4763* (2006.01)

(52) U.S. Cl. .............. 438/626; 438/629; 438/633; 257/E21.576; 257/E21.577

(58) Field of Classification Search ......... 438/624, 438/626, 631, 633, 640, 625, 627–629; 257/E21.576, 257/E21.577, E21.578
See application file for complete search history.

(56) References Cited

U.S. PATENT DOCUMENTS 6,096,651 A * 8/2000 Wang et al. ............. 438/691
6,150,259 A * 11/2000 Wu et al. ................. 438/628
6,358,844 B1 * 3/2002 Wang et al. .............. 438/654
6,429,126 B1 * 8/2002 Herner et al. ............ 438/680
2003/0001265 A1 * 1/2003 Fortin ....................... 257/751
2004/0209461 A1 * 10/2004 Han ......................... 438/653

* cited by examiner

*Primary Examiner*—Thanhha Pham
(74) *Attorney, Agent, or Firm*—Finnegan, Henderson, Farabow, Garrett & Dunner, L.L.P.

(57) ABSTRACT

Disclosed are a method for forming a metal interconnection and a semiconductor device including the metal interconnection. The method includes the steps of forming a slope by etching a corner of a contact hole, which exposes a predetermined pattern formed on a substrate, forming a barrier metal layer on an interlayer dielectric layer, plasma-treating the barrier metal layer with hydrogen and nitrogen gases for about 27 to 37 seconds, heat-treating the substrate in a nitrogen atmosphere, forming a tungsten layer on the barrier metal layer through a two-step nucleation process and bulk deposition process, and performing a chemical mechanical polishing process on the tungsten layer until the interlayer dielectric layer is exposed. The method and the semiconductor device prevent defects of the metal interconnection, such as a volcano defect caused by fluorine penetration.

24 Claims, 16 Drawing Sheets

*W residue*

18d

*Oxide loss*

14

| | Condition | | Volcano Defect |
|---|---|---|---|
| | Sputter Etch | Ti | |
| (a) | X | 360 Å | ◎ |
| (b) | X | 250 Å | ○ |
| (c) | X | 200 Å | △ |
| (d) | X | 100 Å | none |
| (e) | 85 Å | 360 Å | △ |
| (f) | 85 Å | 200 Å | none |

\* ◎ (many) >> ○ > △ (a few)

FIG. 15
| | (a) | (b) | (c) | (d) |
|---|---|---|---|---|
| Ti | 230 Å | 230 Å | 230 Å | 230 Å |
| CVD TiN Plasma Treatment (2×50) | 60sec×2 | 50sec×2 | 40sec×2 | 30sec×2 |
| Volcano | ◎ | ○ | none | none |
| Defect Map | 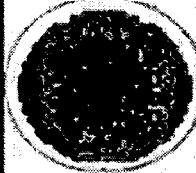 | 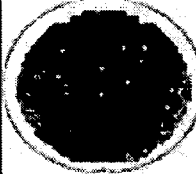 | 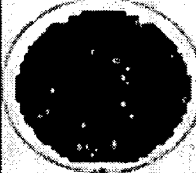 | 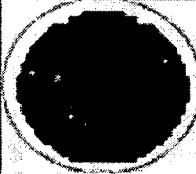 |
| | (e) | (f) | (g) |
|---|---|---|---|
| Ti | 200 Å | 200 Å | 200 Å |
| CVD TiN Plasma Treatment (2×50) | 30sec×2 | 40sec×2 | 60sec×2 |
| Volcano | none | △(1point) | ◎ |
| Defect Map |  | 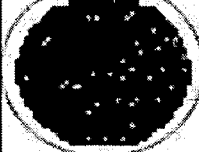 |  |

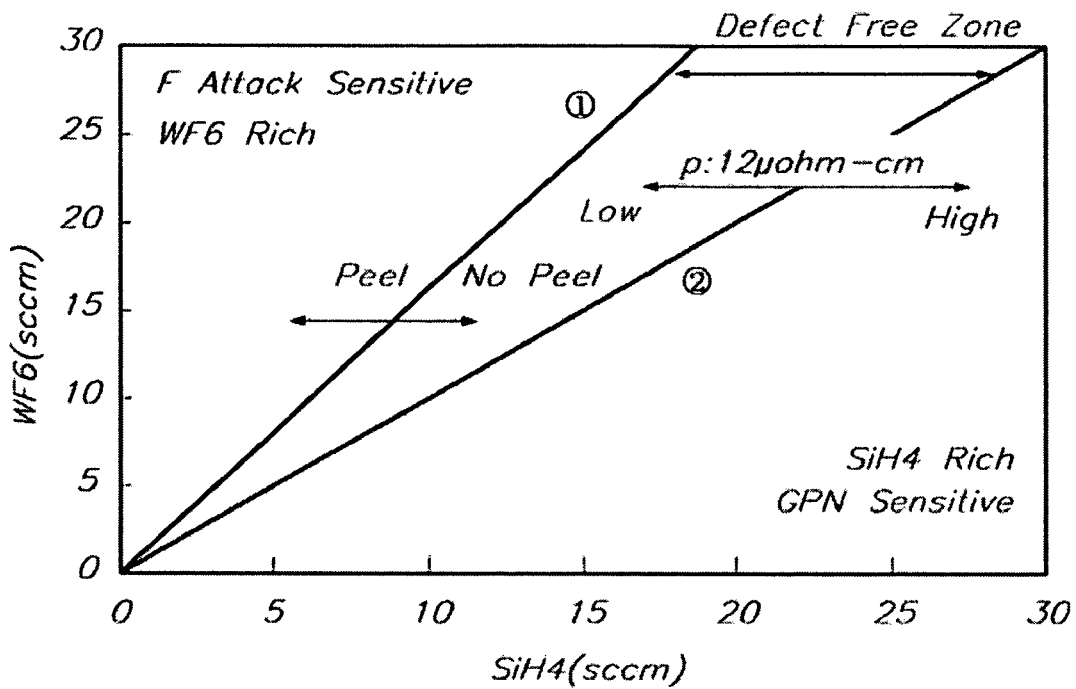

FIG. 20

| Chamber | Rs Down (incubation time) | Volcano |
|---|---|---|
| A | > 1.0sec | none |
| B | > 1.0sec | none |
| C | > 1.0sec | none |
| D | < 0.5sec | ◎ |

US 7,635,644 B2

SEMICONDUCTOR DEVICE INCLUDING METAL INTERCONNECTION AND METHOD FOR FORMING METAL INTERCONNECTION

RELATED APPLICATION

This application is based upon and claims the benefit of priority to Korean Application No. 10-2005-0094956, filed on Oct. 10, 2005, the entire contents of which are incorporated herein by reference.

BACKGROUND

1. Technical Field

The present invention relates to a semiconductor device including a metal interconnection and a method for forming the metal interconnection.

2. Description of the Related Art

There are great demands for device application technologies using various interconnection materials to produce high-speed and high-integration semiconductor devices. A semiconductor manufacturing process is classified into either an FEOL (front end of the line) process for forming a transistor on a silicon substrate or a BEOL (back end of the line) process for forming metal interconnections. The process for forming metal interconnections refers to a process for electrically connecting devices fabricated through a planar process to each other to obtain an integrated circuit. That is, contact holes and via holes are formed through the interconnection forming process to connect semiconductor devices with metal interconnection layers and to electrically connect interconnection layers with each other.

Current interconnection technology for forming metal interconnections mainly includes an interlayer dielectric layer forming process, a silicide forming process, a barrier metal forming process, and a metal interconnection forming process. The interconnection technology is used to minimize electric delay and loss of signals when the signals are transmitted between devices while allowing the devices to have superior response speed and reliability.

The interlayer dielectric layer mainly includes a silicon oxide ($SiO_2$) layer, which may be deposited through typical deposition processes, and the metal interconnection material includes tungsten (W) or aluminum (Al). If tungsten is used for the metal interconnection, a barrier metal layer having a dual-layer structure comprising titanium/titanium nitride layers (Ti/TiN layers) must be formed between the tungsten metal interconnection and the interlayer dielectric layer to improve the adhesion property between the tungsten metal interconnection and the interlayer dielectric layer and to prevent metal diffusion. In the interconnection process, Ti/TiN/W/Ti/TiN layers are stacked on the oxide layer, which serves as an interlayer dielectric layer, and then a metal interconnection is formed through a photolithography process. The above process may repeat several times to form a dual-layer metal interconnection or a multi-layer metal interconnection.

During the interconnection forming process, a barrier metal layer is prepared in the form of a dual-layer structure consisting of a titanium (Ti) layer and a titanium nitride (TiN) layer producing superior step coverage and anti-diffusion characteristics. The Ti layer improves the step coverage at the bottom of a hole, thereby reducing the contact resistance. The Ti layer is formed through an ionized metal plasma (IMP) process. In addition, the TiN layer is formed through a chemical vapor deposition (CVD) process. That is, the TiN layer is formed using a CVD process performed at a temperature of about 400° C. such that tetrakis-dimethyl-amido-titan (TDMAT) can be thermally decomposed, thereby forming a porous, amorphous TiN layer. Then, a hydrogen/nitrogen ($H_2/N_2$) plasma treatment is performed, thereby forming a crystalline TiN layer. The TiN layer formed through the CVD process produces superior step coverage, so that the TiN layer is used as an adhesion layer for tungsten (W) while serving as a diffusion barrier to prevent fluorine penetration of tungsten hexafluoride ($WF_6$).

Tungsten (W), which is typically a material for metal interconnections, is deposited by a CVD process in a nucleation step and then a bulk deposition step. In the nucleation step, $WF_6$ reacts with silicon hydride (silane ($SiH_4$)), thereby forming a tungsten crystal nucleus as expressed by the formula

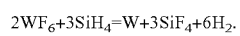

In the bulk deposition step, $WF_6$ reacts with hydrogen ($H_2$), thereby forming tungsten as expressed by the formula

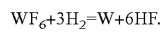

However, the above metal interconnection process has the following problems. Since the Ti layer used for the barrier metal layer is deposited through a sputtering process, an overhang 16b is formed in the vicinity of an inlet of a contact hole 15 as shown in FIG. 1. Overhang 16b becomes enlarged as the thickness of a Ti layer 16 increases. Then, a TiN layer 17, having an amorphous phase, is formed through the CVD process. The amorphous phase of TiN layer 17 can be converted into the crystalline phase through $H_2/N_2$ plasma treatment. Since TiN layer 17 represents the superior step coverage characteristics, TiN layer 17 is deposited along a profile of Ti layer 16, so overhang 16b still remains in the vicinity of the inlet of the contact hole. In addition, when performing the plasma treatment process, plasma is concentrated onto overhang 16b, so that the structure of TiN layer 17 is changed from the porous amorphous structure to the columnar structure. In this case, micro cracks may occur in TiN layer 17, causing deformation of TiN layer 17. Furthermore, since the plasma rarely reaches a shadow area 17d formed at the bottom of overhang 16b, the porous amorphous TiN layer may not be changed into the crystalline TiN layer. In this state, if the tungsten deposition process is performed, fluorine diffusion may occur at shadow area 17d formed at the bottom of overhang 16b. That is, fluorine penetrates through the porous amorphous TiN layer 17, so that fluorine makes contact with Ti layer 16 formed below TiN layer 17, thereby causing a volcano defect 17c as shown in FIG. 2.

In addition, hydrogen generated during the nucleation step reacts with $WF_6$, thereby forming tungsten (W) and hydrogen fluoride (HF). Thus, "HF+F" may diffuse into the barrier metal layer and makes contact with Ti layer 16, thereby forming $TiF_x$ as expressed by the formula

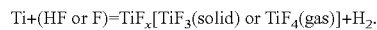

Since $TiF_4$ is a volatile gas, $TiF_4$ may lift TiN layer 17 when it is evaporated, so that a TiN lifting 17b may occur as shown in FIG. 3B.

In the case of a serious TiN lifting 17d (see FIG. 3A), a seam formed in contact hole 15 has a small size as shown in FIG. 3C. However, in the case of a weak TiN lifting 17f (see FIG. 3A), TiN lifting 17b may block the inlet of contact hole 15, so that a seam 18b of a large size is formed in contact hole 15 when tungsten 18 has been deposited, thereby forming the volcano defect 17c as shown in FIG. 3D.

As shown in FIG. 4A, such a volcano defect causes a "contact not fill" phenomenon 18c. In addition, when a tungsten polishing process is performed, a portion with the volcano defect has a lower removal rate than that of a portion without the volcano defect, so that tungsten residues 18d are formed as shown in FIG. 4B. For this reason, over polishing is carried out in order to remove the tungsten residues 18d. However, over polishing may cause damage to an oxide layer 14 as shown in FIG. 4C.

SUMMARY OF THE INVENTION

Accordingly, the present invention is directed to a semiconductor device including a metal interconnection and a method for forming the metal interconnection that substantially obviate one or more of the problems due to limitations and disadvantages of the related art.

An embodiment consistent with the present invention provides a semiconductor device including a metal interconnection and a method for forming the metal interconnection, capable of preventing defects, such as volcano defects, by optimizing the process conditions when forming a barrier metal layer and a tungsten interconnection.

Additional advantages and features of the invention will be set forth in part in the description which follows and in part will become apparent to those having ordinary skill in the art upon examination of the following or may be learned from practice of the invention. Other advantages and features of the invention may be realized and attained by the structure particularly pointed out in the written description and claims hereof as well as the appended drawings.

Consistent with a first embodiment of the present invention, a method of forming a metal interconnection includes the steps of: forming an interlayer dielectric layer on a substrate having a predetermined pattern; selectively etching the interlayer dielectric layer, thereby forming a contact hole for exposing a device; forming a slope by etching a corner of the contact hole; forming a barrier metal layer on the interlayer dielectric layer including the contact hole; forming a tungsten layer on the barrier metal layer including the contact hole; and performing a chemical mechanical polishing process on the tungsten layer until the interlayer dielectric layer is exposed.

Consistent with a second embodiment of the present invention, a method of forming a metal interconnection includes the steps of: forming an interlayer dielectric layer on a substrate having a predetermined pattern; selectively etching the interlayer dielectric layer, thereby forming a contact hole for exposing a device; forming a barrier metal layer on the interlayer dielectric layer including the contact hole; heat-treating the substrate in a nitrogen atmosphere; forming a tungsten layer on the barrier metal layer including the contact hole; and performing a chemical mechanical polishing process on the tungsten layer until the interlayer dielectric layer is exposed.

Consistent with a third embodiment of the present invention, a method of forming a metal interconnection includes the steps of: forming an interlayer dielectric layer on a substrate having a predetermined pattern; selectively etching the interlayer dielectric layer, thereby forming a contact hole for exposing a device; forming a barrier metal layer on the interlayer dielectric layer including the contact hole; plasma-treating the barrier metal layer with hydrogen and nitrogen gases for about 27 to 37 seconds; forming a tungsten layer on the barrier metal layer including the contact hole; and performing a chemical mechanical polishing process on the tungsten layer until the interlayer dielectric layer is exposed.

Consistent with a fourth embodiment of the present invention, a method of forming a metal interconnection includes the steps of: forming an interlayer dielectric layer on a substrate having a predetermined pattern; selectively etching the interlayer dielectric layer, thereby forming a contact hole for exposing a device; forming a barrier metal layer on the interlayer dielectric layer including the contact hole; forming a tungsten layer on the barrier metal layer including the contact hole by performing a two-step nucleation process and bulk deposition process; and performing a chemical mechanical polishing process on the tungsten layer until the interlayer dielectric layer is exposed.

Consistent with a fifth embodiment of the present invention, a method of forming a metal interconnection includes the steps of: forming an interlayer dielectric layer on a substrate having a predetermined pattern; selectively etching the interlayer dielectric layer, thereby forming a contact hole for exposing a device; forming a slope by etching a corner of the contact hole; forming a barrier metal layer on the interlayer dielectric layer including the contact hole; plasma-treating the barrier metal layer with hydrogen and nitrogen for about 27 to 37 seconds; heat-treating the substrate in a nitrogen atmosphere; forming a tungsten layer on the barrier metal layer including the contact hole by performing a two-step nucleation process and bulk deposition process; and performing a chemical mechanical polishing process on the tungsten layer until the interlayer dielectric layer is exposed.

Consistent with a sixth embodiment of the present invention, a method of forming a metal interconnection includes the steps of: forming an interlayer dielectric layer on a substrate having a predetermined pattern; selectively etching the interlayer dielectric layer, thereby forming a via hole for exposing the metal interconnection; forming a slope by etching a corner of the via hole; forming a barrier metal layer on the interlayer dielectric layer including the via hole; plasma-treating the barrier metal layer with hydrogen and nitrogen gases for about 27 to 37 seconds; heat-treating the substrate in a nitrogen atmosphere; forming a tungsten layer on the barrier metal layer including the via hole by performing a two-step nucleation process and bulk deposition process; and performing a chemical mechanical polishing process on the tungsten layer until the interlayer dielectric layer is exposed.

Consistent with a seventh embodiment of the present invention, there is provided a semiconductor device including: a predetermined pattern formed on a substrate; an interlayer dielectric layer formed on the predetermined pattern; a contact hole formed through the interlayer dielectric layer to expose the predetermined pattern; a barrier metal layer formed in the contact hole; and a tungsten layer formed on the barrier metal layer, wherein a corner of the contact hole is sloped.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the present invention and are incorporated in and constitute a part of this application, illustrate embodiment(s) consistent with the present invention together with the description, and serve to explain the principle of the present invention.

FIG. 15 is a table illustrating measurement results of a volcano defect according to the thickness of a Ti layer and the plasma treatment for a TiN layer;

FIG. 18 is a graph showing the characteristics of tungsten according to a ratio of $WF_6:SiH_4$;

FIG. 19 is a table illustrating measurement results of a volcano defect according to the sputter etch thickness, Ti layer thickness, and tungsten nucleation; and FIG. 20 is a view showing measurement results of a volcano defect according to the incubation time of each chamber.

DETAILED DESCRIPTION

Hereinafter, a preferred embodiment of the present invention will be described with reference to the accompanying drawings.

FIGS. 5 to 12 are sectional views illustrating a method for forming a metal interconnection consistent with an embodiment of the present invention.

Figure 1:
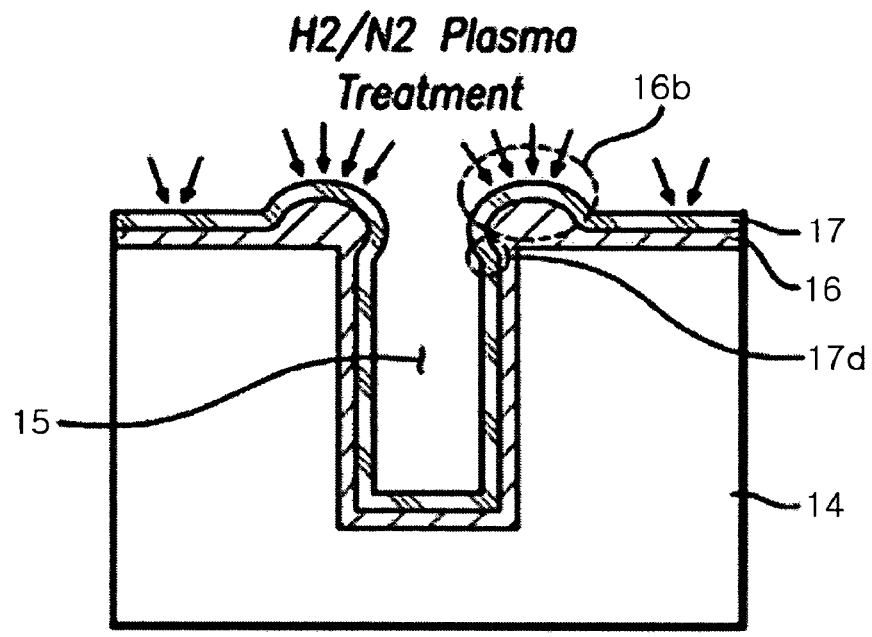
FIG. 1 is a sectional view illustrating an overhang and a shadow area formed around an inlet of a hole.
Figure 2:
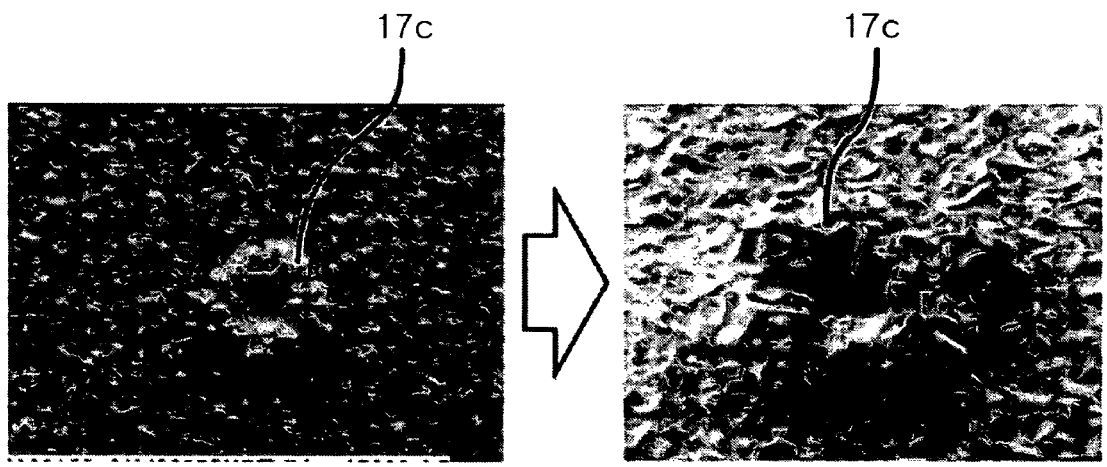
FIG. 2 is a micrograph illustrating a volcano defect.
Figure 3A:
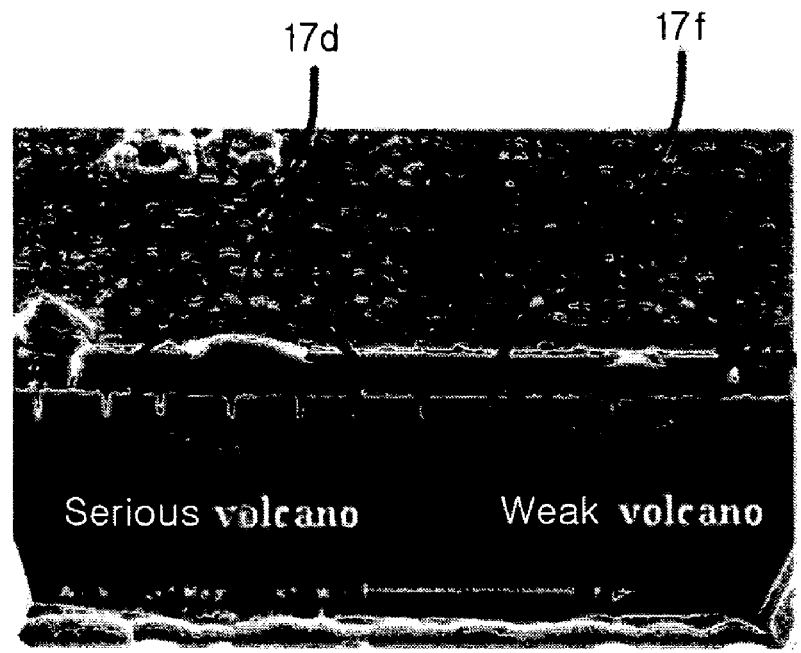
FIG. 3A is a sectional view of a micrograph illustrating a volcano defect.
Figure 3B:
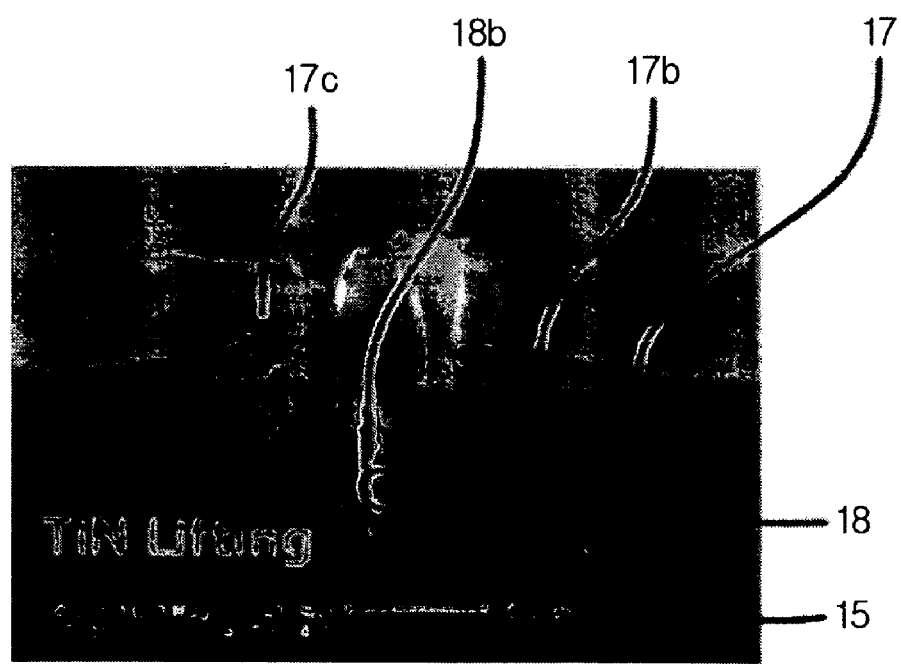
FIG. 3B is a micrograph illustrating a TiN lifting.
Figure 3C:
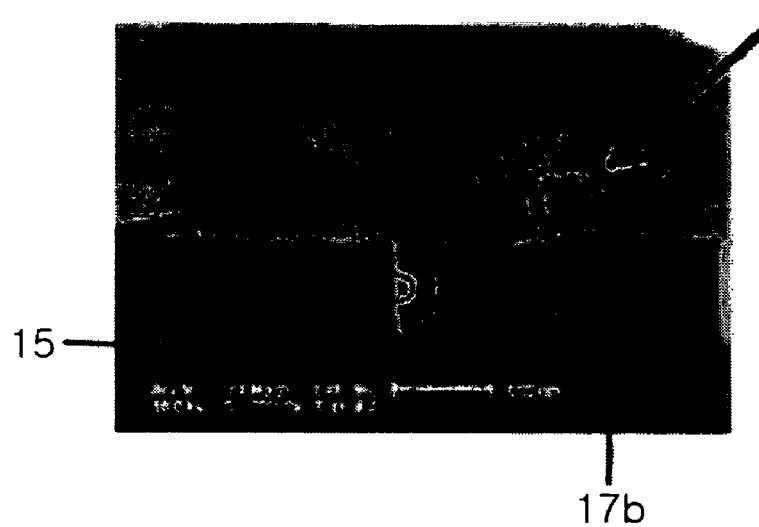
FIG. 3C is a micrograph illustrating a serious volcano defect.
Figure 3D:
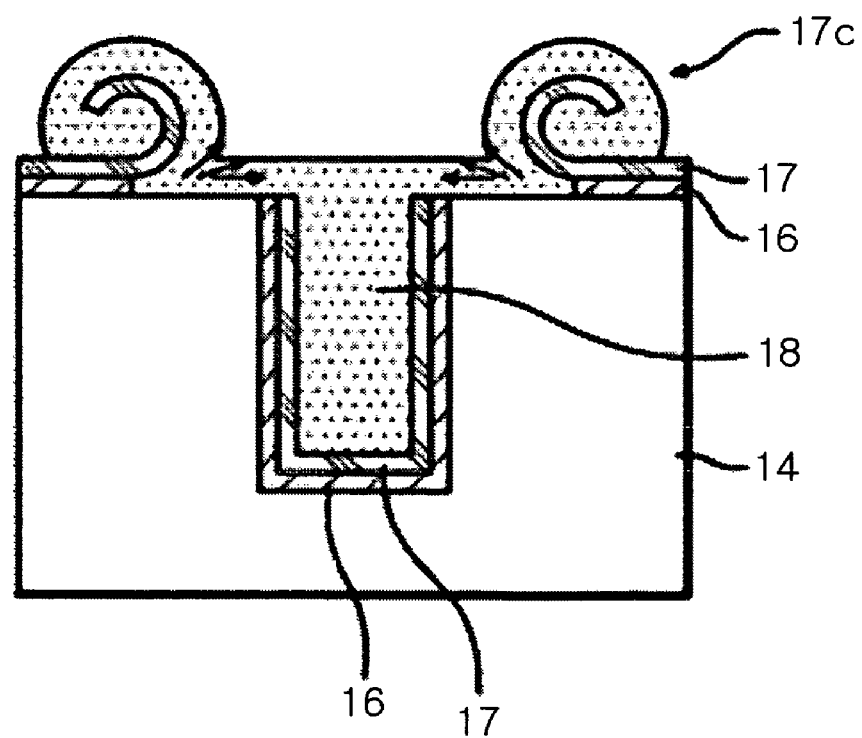
FIG. 3D is a sectional view illustrating a volcano detect.
Figure 4A:
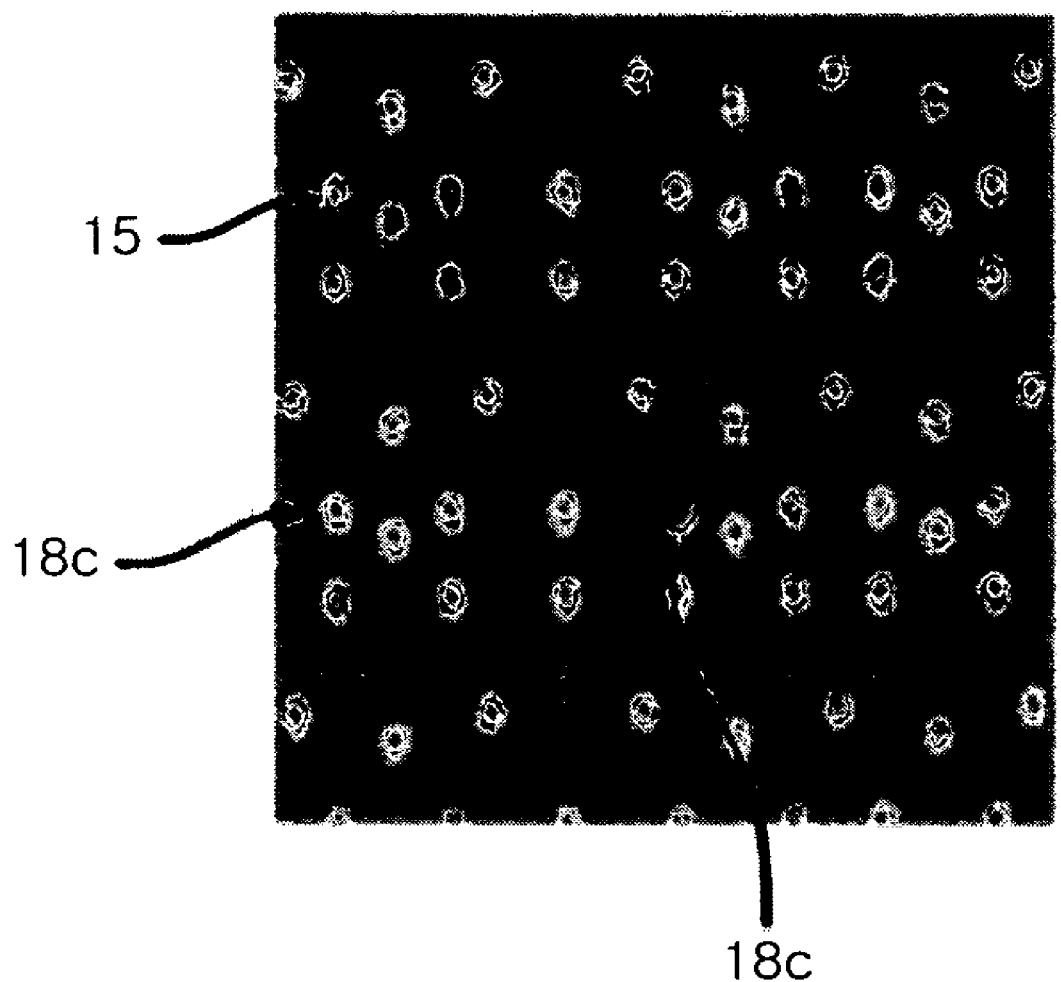
FIG. 4A is a view illustrating a contact not fill phenomenon derived from a volcano defect after a tungsten CMP process has been finished.
Figure 4B:
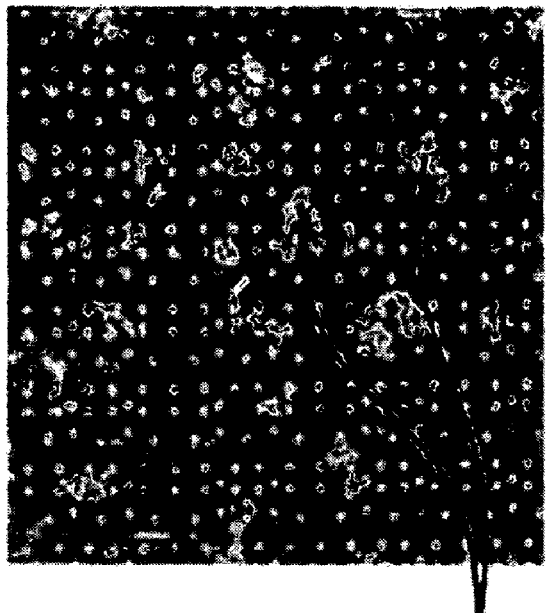
FIG. 4B is a view illustrating tungsten residues derived from a volcano defect after a tungsten CMP process has been finished.
Figure 4C:
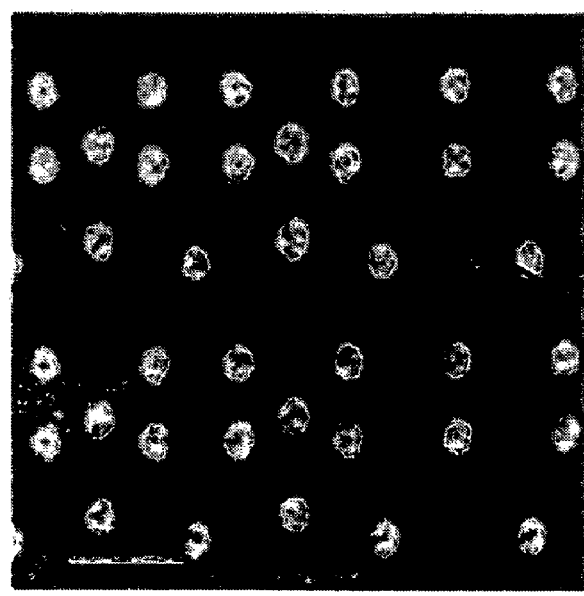
FIG. 4C is a view illustrating oxide loss derived from a volcano defect after a tungsten CMP process has been finished.
Figure 5:
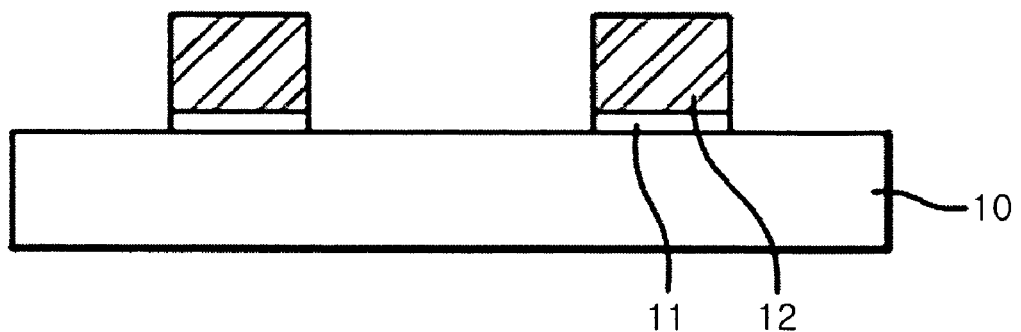
FIGS. 5 to 12 are sectional views illustrating a method for forming a metal interconnection consistent with an embodiment of the present invention.

Referring to FIG. 5, a gate insulating layer and a gate conductive layer are sequentially formed on a substrate 10. Then, the gate insulating layer and the gate conductive layer are selectively patterned, thereby forming a gate electrode 12 including the gate insulating layer 11. After that, a silicide metal (not shown) is formed on the entire surface of substrate 10 and an annealing process is performed in order to form the silicide (not shown) on gate electrode 12.

Figure 6:
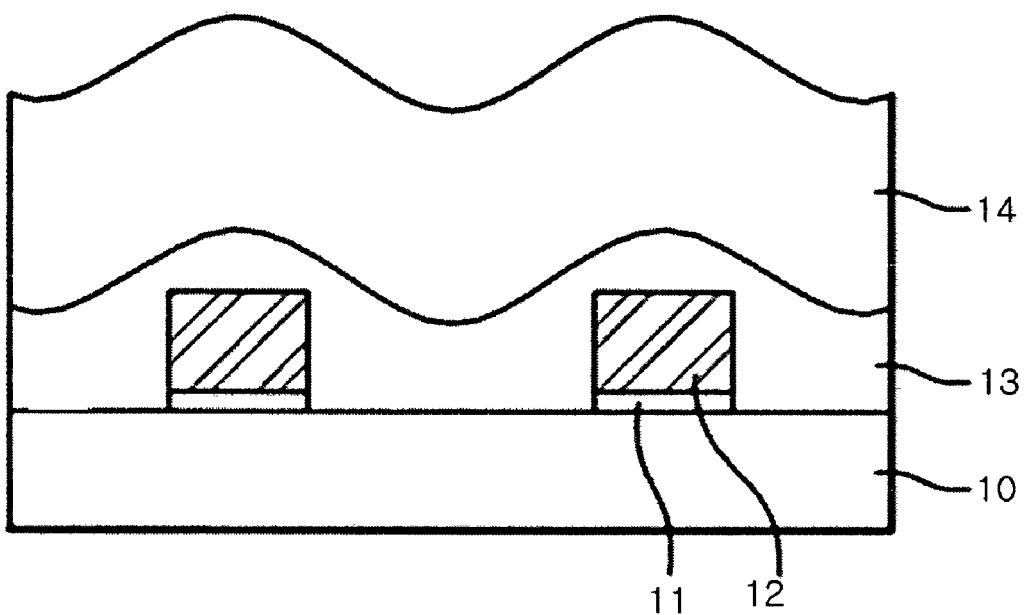

Referring to FIG. 6, a first interlayer dielectric layer 13, which is a silicon oxide ($SiO_2$) layer, is formed on the entire surface of substrate 10 having gate electrode 12 through a CVD process. After that, a second interlayer dielectric layer 14, which is a silicon oxide layer, is formed on first interlayer dielectric layer 13 through a CVD process. At this time, second interlayer dielectric layer 14 has a curved shape due to the step difference between lower devices, such as gate insulting layer 11 and gate electrode 12.

Figure 7:
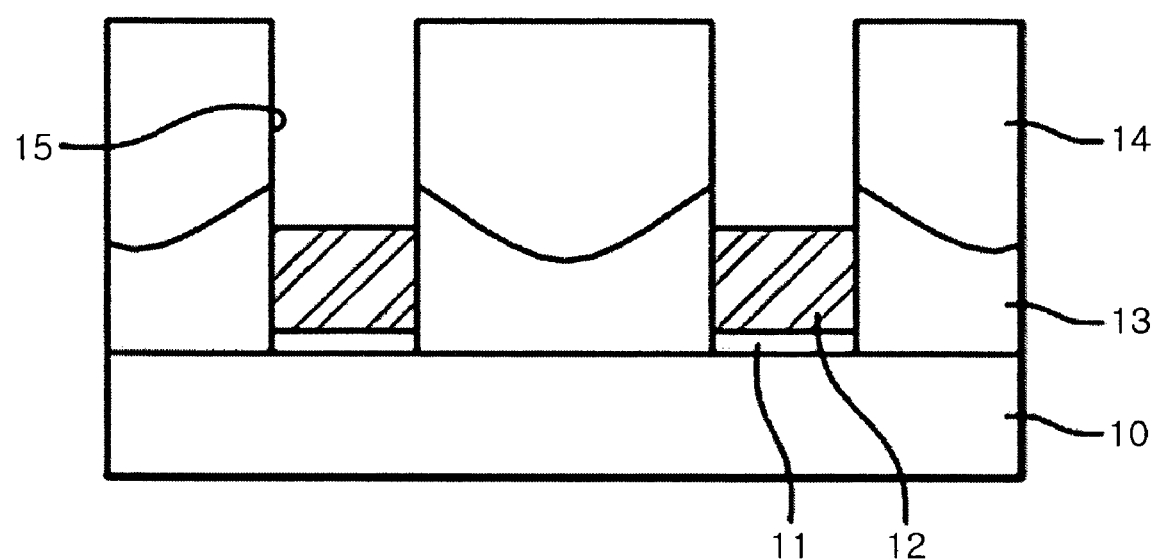

Referring to FIG. 7, second interlayer dielectric layer 14 is planarized through a chemical mechanical polishing (CMP) process. Then, second interlayer dielectric layer 14 and first interlayer dielectric layer 13 are selectively etched through a general photolithography process, thereby forming contact holes 15 for exposing gate electrode 12.

Figure 8:
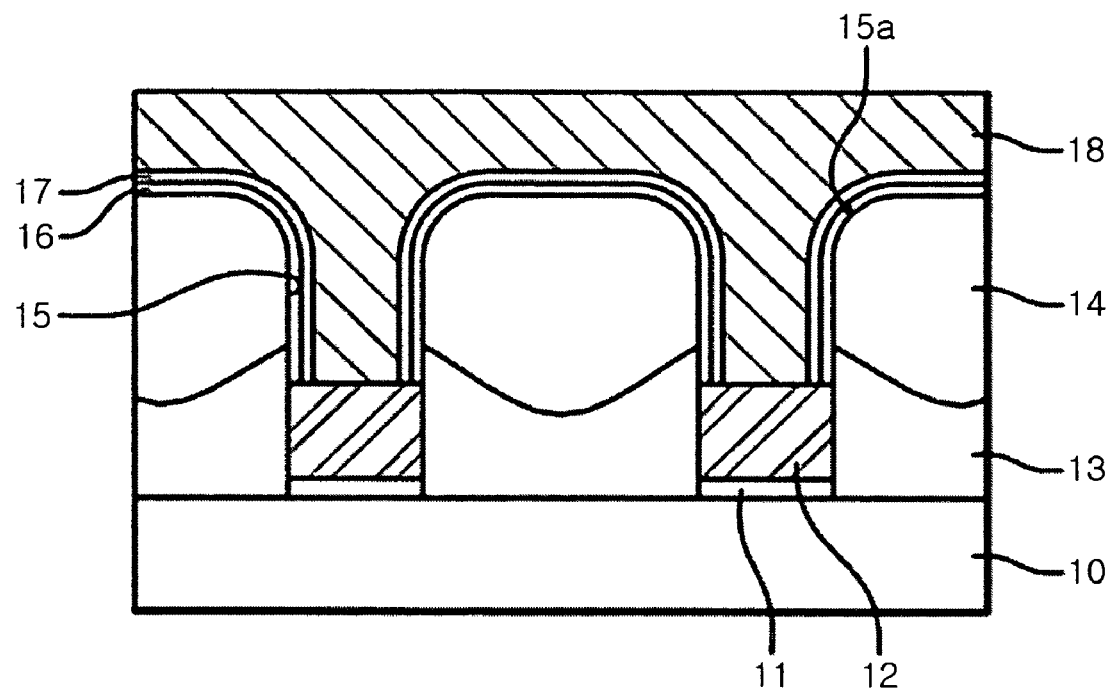

Then, as shown in FIG. 8, a barrier metal layer is formed on second interlayer dielectric layer 14 and within contact hole 15. At this time, the barrier metal layer has a dual-layer structure including a first Ti layer 16 and a first TiN layer 17. Before the barrier metal layer is deposited, an argon (AR) sputtering is performed by using radio frequency (RF) power, such that a corner 15a formed in the vicinity of an inlet of contact hole 15 is etched in the form of a slope. In addition, first Ti layer 16 is deposited in contact hole 15 through an ionized metal plasma (IMP) process with a deposition thickness of about 250 Å or less. Since the slope is formed at the inlet of contact hole 15 and first Ti layer 16 has a shallow thickness of about 250 Å or less, an overhang formed in the vicinity of the inlet of contact hole 15 can be minimized. After that, the CVD process is performed at the temperature of about 400° C. such that tetrakis-dimethyl-amido-titan (TD-MAT) can be thermally decomposed, thereby forming a porous amorphous TiN layer 17 on first Ti layer 16. Then, a plasma treatment is performed to allow the porous amorphous TiN layer 17 to have high density crystalline structure. The plasma treatment is performed for about 27 to 37 seconds while feeding hydrogen and nitrogen gases.

Next, substrate 10 formed with the dual-layer structure of first Ti layer 16 and first TiN layer 17 is subject to a rapid terminal process (RTP). The RTP is performed at a temperature of about 700° C. or above while feeding nitride gas. The RTP is intended to reduce the contact resistance between the dual layer (first Ti layer 16 and first TiN layer 17) of the barrier metal layer and silicide (not shown) formed in gate electrode 12. Since the RTP is performed in a 100% nitrogen atmosphere, nitrogen penetrates into the grain boundary of first TiN layer 17, so that the nitrogen atmosphere is formed on the surface of first TiN layer 17 (stuffing effect) and nitrogen diffusion is created. Thus, first Ti layer 16 formed below first TiN layer 17 may partially react with nitrogen. Accordingly, the thickness of first TiN layer 17 may increase, thereby effectively preventing the occurrence of the fluorine diffusion phenomenon when tungsten is formed.

After that, first tungsten 18 is formed on the barrier metal layer such that contact hole 15 is sufficiently filled with first tungsten 18. First tungsten 18 is formed by performing the CVD process consisting of first and second nucleation steps and a bulk deposition step. The first nucleation step is an initial incubation step, which is performed for about 2 to 3 seconds while setting the ratio of $WF_6:SiH_4$ to 1:1 (about 15 sccm:15 sccm) such that fluorine penetration can be minimized, thereby primarily forming first tungsten 18 with a thickness of about 80 Å or less. The second nucleation step is performed by setting the ratio of $WF_6:SiH_4$ to 2:1, thereby secondarily forming first tungsten 18 with a thickness of about 300 to 500 Å. Then, the bulk deposition step is performed by using $WF_6$, hydrogen, and argon gas to form first tungsten 18 with a thickness of about 3000 to 4500 Å such that contact hole 15 can be filled with tungsten 18. In order to minimize the fluorine penetration when forming the first tungsten, the ratio of $WF_6:SiH_4$ is preferably set to 1:1, which is different from the conventional 2:1 ratio of $WF_6:SiH_4$. As the ratio of $WF_6:SiH_4$ decreases, the fluorine penetration is also decreased, so that the volcano defect that forms due to TiN lifting can be prevented. However, if the nucleation step is performed by reducing the ratio of $WF_6:SiH_4$, the process time for forming the first tungsten may increase. In order to solve this problem, the nucleation step is divided into first and second nucleation steps when forming the tungsten, in which the first nucleation step is performed for about 2 to 3 seconds while setting the ratio of $WF_6:SiH_4$ to 1:1 which can minimize the fluorine penetration, and then the second nucleation step is performed while setting the ratio of $WF_6$:$SiH_4$ to 2:1, thereby shortening the process time for the tungsten.

Figure 9:
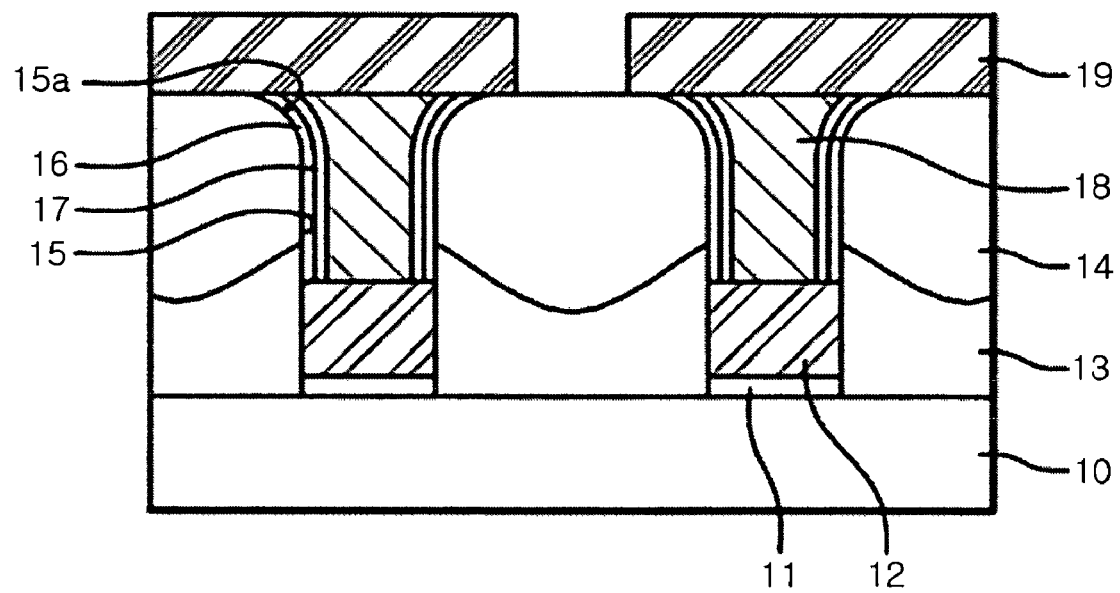

Referring to FIG. 9, first tungsten 18 is then subjected to a chemical mechanical polishing (CMP) process until second interlayer dielectric layer 14 has been exposed, thereby forming a contact. Next, after forming an aluminum layer on the contact, the aluminum layer is selectively etched through a photolithography process, thereby forming a first metal interconnection layer 19. First metal interconnection layer 19 is electrically connected to first tungsten 18 filled in contact hole 15.

Figure 10:
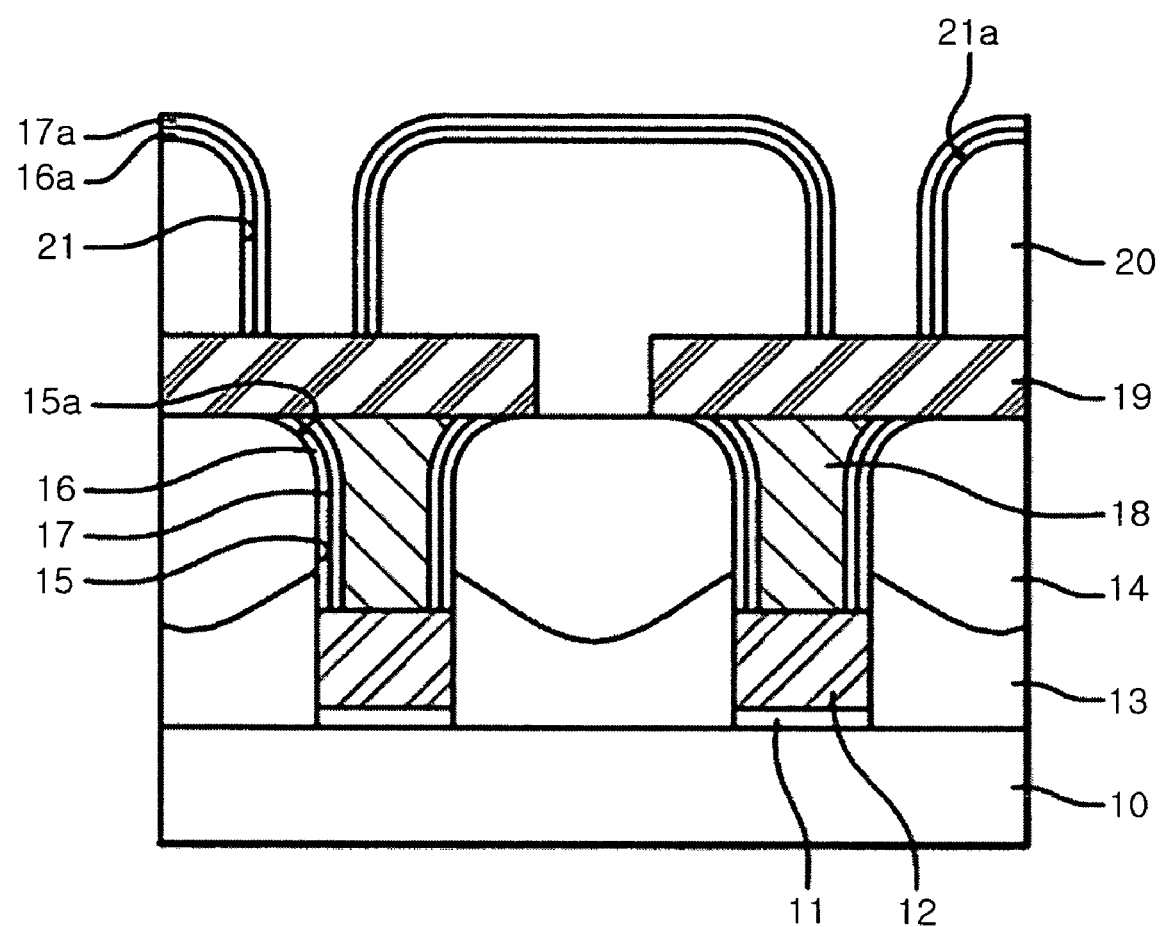

After that, as shown in FIG. 10, a third interlayer dielectric layer 20, which is an oxide layer, is formed on first metal interconnection layer 19 through the CVD process.

Then, third interlayer dielectric layer 20 is selectively etched through using a general photolithography process, thereby forming via holes 21 for exposing first metal interconnection layer 19.

Next, a barrier metal layer is formed on third interlayer dielectric layer 20 and within via holes 21. At this time, the barrier metal layer has a dual layer structure including a second Ti layer 16a and a second TiN layer 17a. Before the barrier metal layer is deposited, an argon (AR) sputtering is performed by using radio frequency (RF) power, such that a corner 21a formed in the vicinity of an inlet of via hole 21 is etched in the form of a slope. In addition, second Ti layer 16a is deposited in via hole 21 through an ionized metal plasma (IMP) process with a deposition thickness of about 250 Å or less. Since the slope is formed at the inlet of via hole 21 and second Ti layer 16a has a shallow thickness of about 250 Å or less, an overhang formed in the vicinity of the inlet of via hole 21 can be minimized. After that, second TiN layer 17a is formed on second Ti layer 16a through the CVD process. Then, a plasma treatment is performed so as to allow second TiN layer 17a having the porous amorphous structure to have the crystalline structure of high density. The plasma treatment is performed for about 27 to 37 seconds while feeding hydrogen and nitrogen gases.

Figure 11:
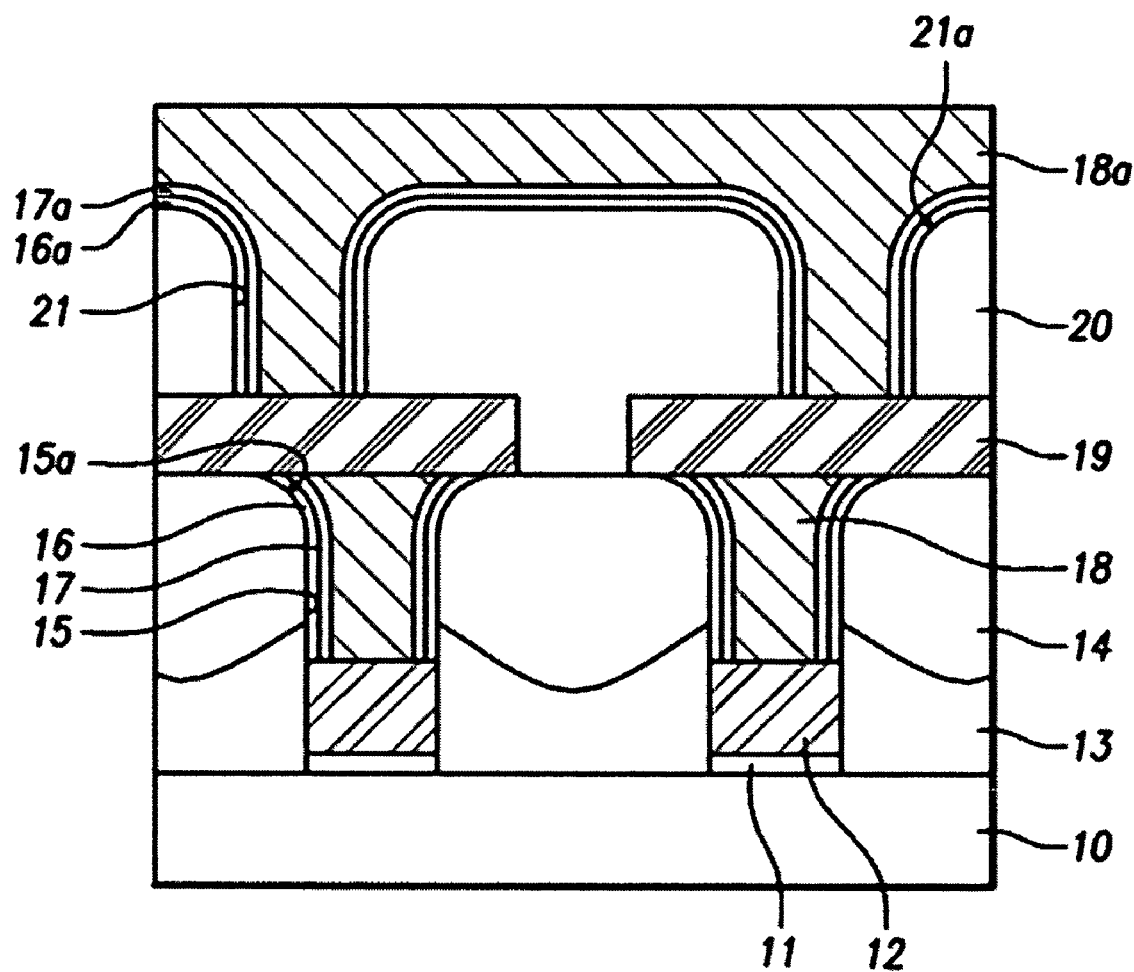

After that, referring to FIG. 11, second tungsten 18a is formed on the barrier metal layer such that via hole 21 is sufficiently filled with first tungsten 18. Second tungsten 18a is formed by performing the CVD process consisting of first and second nucleation steps and a bulk deposition step. The first nucleation step is an initial incubation step, which is performed for about 2 to 3 seconds while setting the ratio of $WF_6$:$SiH_4$ to 1:1 (about 15 sccm:15 sccm) such that fluorine penetration can be minimized, thereby primarily forming second tungsten 18a with a thickness of about 80 Å or less. The second nucleation step is performed by setting the ratio of $WF_6$:$SiH_4$ to 2:1, thereby secondarily forming second tungsten 18a with a thickness of about 300 to 500 Å. Then, the bulk deposition step is performed by using $WF_6$, hydrogen, and argon gas to form tungsten 18 with a thickness of about 3000 to 4500 Å such that via hole 21 can be filled with second tungsten 18a. In order to minimize the fluorine penetration when forming the second tungsten, the ratio of $WF_6$:$SiH_4$ is preferably set to 1:1, which is different from the conventional 2:1 ratio of $WF_6$:$SiH_4$. As the ratio of $WF_6$:$SiH_4$ decreases, the fluorine penetration is also decreased, so that the volcano defect that forms due to TiN lifting can be prevented. However, if the nucleation step is performed by reducing the ratio of $WF_6$:$SiH_4$, the process time for forming the second tungsten may lengthen. In order to solve this problem, the nucleation step is divided into first and second nucleation steps when forming the second tungsten, in which the first nucleation step is performed for about 2 to 3 seconds while setting the ratio of $WF_6$:$SiH_4$ to 1:1 which can minimize the fluorine penetration, and then the second nucleation step is performed while setting the ratio of $WF_6$:$SiH_4$ to 2:1, thereby shortening the process time for the tungsten.

Figures 12, 13:
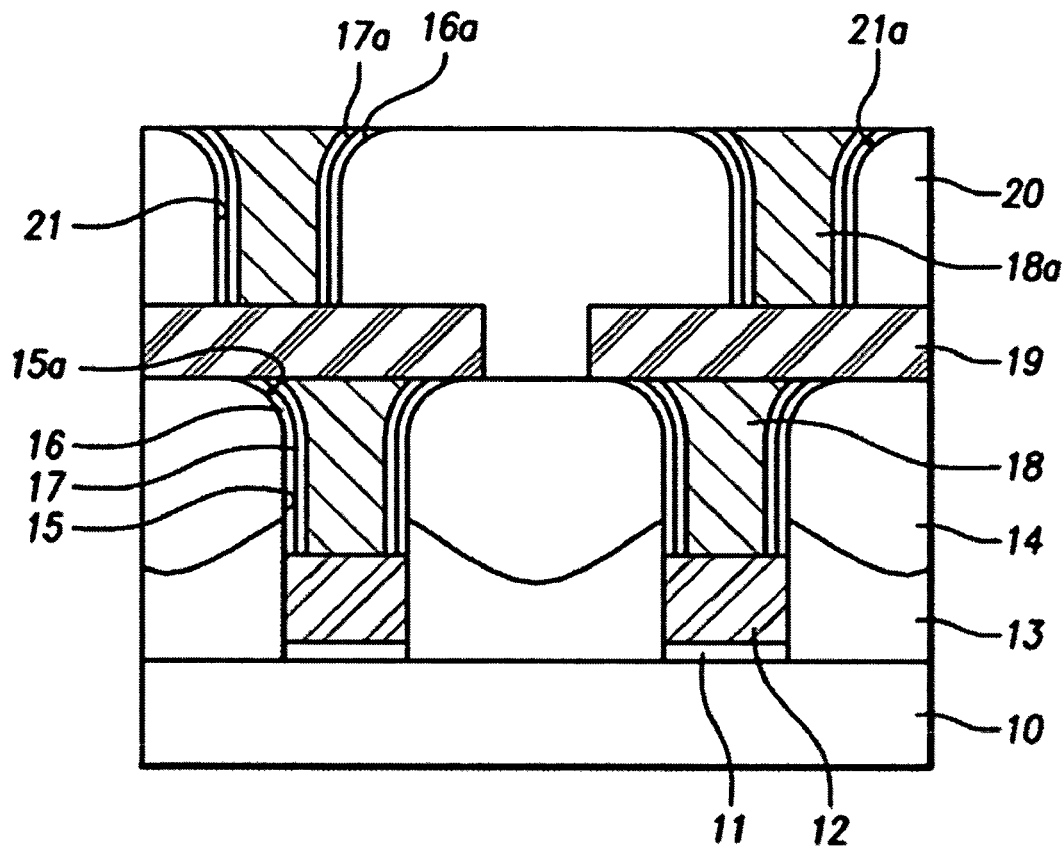
FIG. 13 is a table illustrating test results obtained by changing conditions for the sputter etch thickness and deposition thickness of a Ti layer.

Then, referring to FIG. 12, second tungsten 18a is subject to a chemical mechanical polishing (CMP) process until third interlayer dielectric layer 20 has been exposed, thereby forming the second metal interconnection. The above process may be repeated several times, thereby forming a three-layered metal interconnection or a multi-layered metal interconnection. After that, typical processes are performed in order to complete the fabrication of the semiconductor device.

Hereinafter, description will be made in relation to the characteristics of the metal interconnection according to the present invention.

The characteristics of the Ti/TiN layers used as the barrier metal layer in the present invention are as follows:

FIG. 13 is a table illustrating test results obtained by changing conditions for the argon sputter etch and deposition thickness of the Ti layer. When the thickness of the Ti layer is 100 Å ((d) in FIG. 13), and when the sputter etch thickness is 85 Å and the thickness of the Ti layer is 200 Å ((f) in FIG. 13), the volcano defect does not occur. It can be understood from these test results that the volcano defect is reduced as the thickness of the Ti layer is reduced.

Figure 14:
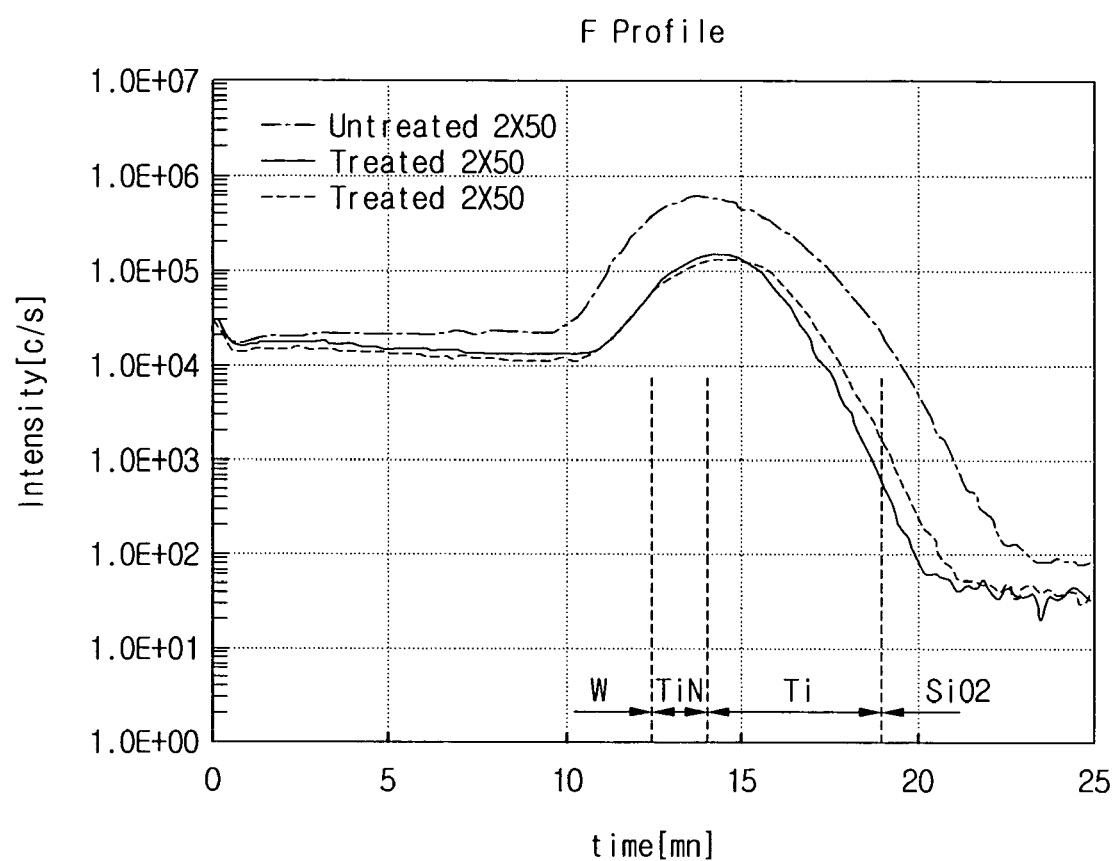
FIG. 14 is a graph showing a fluorine depth profile when a TiN layer is treated and untreated with plasma.

FIG. 14 is a graph showing a fluorine depth profile in a metal interconnection when a TiN layer is treated and untreated with plasma, which is measured by a secondary ion mass spectrometry (SIMS) in a state that a dual layer including a Ti layer (360 Å) and a TiN layer (100 Å) is formed as a barrier metal layer for the contact hole, and the metal interconnection is formed by tungsten (360 Å). As can be seen in the graph, the TiN layer untreated with plasma has a great amount of fluorine diffusion.

FIG. 15 shows measurement results obtained by changing the thickness (200 to 230 Å) of the Ti layer and the plasma treatment time (30 to 60 seconds) for the TiN layer. The volcano defect does not occur under the conditions of shallow Ti thickness and short plasma treatment time (see (c), (d), and (e) in FIG. 15).

Figure 16:
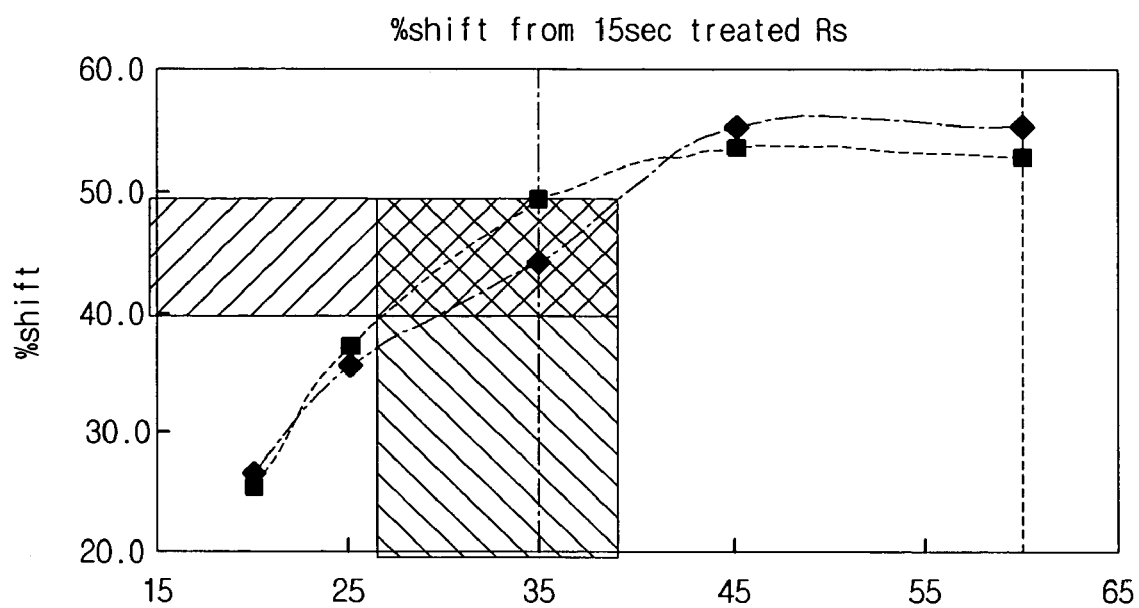
FIG. 16 is a graph showing the variation in a surface resistance of TiN as a function of plasma treatment time.

FIG. 16 is a graph showing the variation in the surface resistance shift (Rs shift) after the plasma treatment. The desired surface resistance of the TiN is achieved when the Rs shift is in a range of 40% to 50%, and the plasma treatment time for the desired surface resistance is 27 to 37 seconds. Since the Rs shift is constant when the plasma treatment time exceeds 45 seconds, the TiN layer may be damaged if the plasma treatment is performed longer than 45 seconds.

Figure 17:
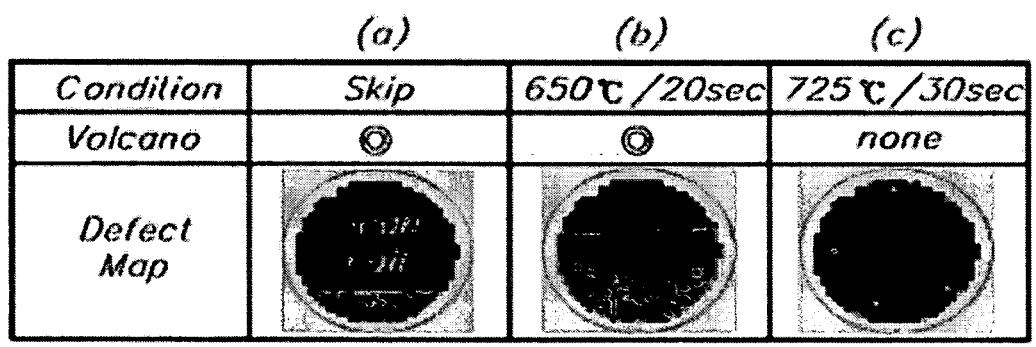
FIG. 17 is a table illustrating measurement results of a volcano defect under the condition of a rapid terminal process (RTP)

FIG. 17 shows measurement results of a volcano defect and particles under the condition of the rapid terminal process (RTP). When the RTP is not performed (see (a) in FIG. 17), a scan fail occurs in an initial stage due to the volcano defect. When the RTP is performed for 20 seconds at the temperature of 650° C. (see (b) in FIG. 17), the scan fail occurs in a final stage due to the volcano defect. In contrast, when the RTP is performed for 30 seconds at the temperature of 750° C. (see (c) in FIG. 17), the volcano defect does not occur. The measurement results show that energy is insufficient for inducing reaction between nitrogen and the Ti layer if the RTP is performed at a low temperature. In order to prevent the volcano defect, the RTP must be performed at a temperature of about 700° C. or above.

Hereinafter, description will be made in relation to the characteristics of tungsten used for the metal interconnection consistent with an embodiment of the present invention.

FIG. 18 is a graph showing the characteristics of the tungsten according to a ratio of $WF_6$:$SiH_4$. In FIG. 18, a $WF_6$ rich area, in which a greater amount of $WF_6$ exists, is sensitive to fluorine diffusion, and a SiH$_4$ rich area, in which a greater amount of SiH$_4$ exists, is sensitive to gas phase nucleation (GPN). In FIG. 18, line ① represents a basis line for the TiN lifting caused by the fluorine penetration according to an amount of WF$_6$, and line ② represents a basis line for the GPN reaction according to an amount of SiH$_4$. The area including a greater amount of SiH$_4$ has higher specific resistance, so that the volcano defect and the particles are created due to a gas phase reaction. Accordingly, the tungsten must be formed under the condition of a defect-free zone, in which the ratio of WF$_6$:SiH$_4$ is 1:1, as shown between lines ① and ②.

FIG. 19 shows measurement results of the volcano defect according to the conditions of sputter etch thickness, Ti layer thickness, and tungsten nucleation. When the tungsten nucleation is performed in two steps (see (b) in FIG. 19), the volcano defect is not formed. In addition, in the case of RF sputter etch, 250 Å Ti layer, and two-step nucleation (see (c) in FIG. 19), the volcano defect is not formed.

However, when one-step nucleation is performed similar to the conventional method, the volcano defect may occur depending on the flow rate of WF$_6$ introduced into a mass flow controller (MFC) at an initial stage. The MFC is designed such that WF$_6$ may reach a predetermined set point within a short period of time, as possible. At this time, since the flow rate of WF$_6$ is increased at the initial stage, a greater amount of tungsten nucleuses is created, so that the incubation time may be shortened. However, in this case, hydrogen created from WF$_6$ and SiH$_4$ may easily react with WF$_6$, rather than SiH$_4$, thereby forming hydrogen fluoride (HF). As the amount of hydrogen that reacts with WF$_6$ increases, the amount of hydrogen fluoride (HF) also increases. As a result, the hydrogen fluoride (HF) may diffuse into the barrier metal layer, thereby causing the volcano defect.

FIG. 20 is a table showing the incubation time of four different chambers, and the effect on the formation of the volcano defect, which is obtained by measuring resistance against tungsten that undergoes the nucleation step for every 0.5 second. When the incubation time is shorter than 0.5 second (see Chamber D in FIG. 20), the volcano defect occurs. Thus, if the reaction speed of WF$_6$ is lowered through the two-step nucleation when the initial incubation is performed, the volcano defect can be prevented regardless of the MFC characteristics.

Consistent with an embodiment of the present invention, the process conditions are optimized when forming the barrier metal layer and the tungsten interconnection, so that the fluorine penetration may not occur. Therefore, the present invention can prevent defects, such as the volcano defect, from being created in the metal interconnection.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a metal interconnection, the method comprising the steps of:
    forming first and second interlayer dielectric layers on a substrate having a predetermined pattern;
    performing a chemical mechanical polishing process to planarize the second interlayer dielectric layer;
    selectively etching the first and second interlayer dielectric layers only up to a top surface of the pattern, thereby forming a contact hole for exposing the pattern;
    forming a slope by etching a corner of the contact hole;
    forming a barrier metal layer only on side surfaces of the first interlayer dielectric layer and on top and side surfaces of the second interlayer dielectric layer including the contact hole, wherein the barrier metal layer only partially covers the top surface of the pattern;
    forming a tungsten layer on the barrier metal layer including the contact hole, wherein the tungsten layer directly contacts the top surface of the pattern; and
    performing a chemical mechanical polishing process on the tungsten layer until the second interlayer dielectric layer is exposed.

2. The method as claimed in claim 1, wherein the barrier metal layer has a dual layer structure including a titanium (Ti) layer and a titanium nitride (TiN) layer.

3. The method as claimed in claim 2, wherein the Ti layer is formed through an ionized metal plasma (IMP) process to have a thickness of about 250 Å or less.

4. The method as claimed in claim 1, wherein the slope is formed through an argon sputtering process using a radio frequency power.

5. A method of forming a metal interconnection, the method comprising the steps of:
    forming first and second interlayer dielectric layers on a substrate having a predetermined pattern;
    performing a chemical mechanical polishing process to planarize the second interlayer dielectric layer;
    selectively etching the first and second interlayer dielectric layers only up to a top surface of the pattern, thereby forming a contact hole for exposing the pattern;
    forming a barrier metal layer only on side surfaces of the first interlayer dielectric layer and on top and side surfaces of the second interlayer dielectric layer including the contact hole, wherein the barrier metal layer only partially covers the top surface of the pattern;
    heat-treating the substrate in a nitrogen atmosphere;
    forming a tungsten layer on the barrier metal layer including the contact hole, wherein the tungsten layer directly contacts the top surface of the pattern; and
    performing a chemical mechanical polishing process on the tungsten layer until the second interlayer dielectric layer is exposed.

6. The method as claimed in claim 5, wherein the heat-treatment step includes a rapid thermal process (RTP) performed at a temperature of about 700° C. or above.

7. A method of forming a metal interconnection, the method comprising the steps of:
    forming first and second interlayer dielectric layers on a substrate having a predetermined pattern;
    performing a chemical mechanical polishing process to planarize the second interlayer dielectric layer;
    selectively etching the first and second interlayer dielectric layers only up to a top surface of the pattern, thereby forming a contact hole for exposing the pattern;
    forming a barrier metal layer only on side surfaces of the first interlayer dielectric layer and on top and side surfaces of the second interlayer dielectric layer including the contact hole, wherein the barrier metal layer only partially covers the top surface of the pattern;
    plasma-treating the barrier metal layer with hydrogen and nitrogen gases for about 27 to 37 seconds;
    forming a tungsten layer on the barrier metal layer including the contact hole, wherein the tungsten layer directly contacts the top surface of the pattern; and
    performing a chemical mechanical polishing process on the tungsten layer until the second interlayer dielectric layer is exposed.

8. A method of forming a metal interconnection, the method comprising the steps of:
- forming first and second interlayer dielectric layers on a substrate having a predetermined pattern;
- performing a chemical mechanical polishing process to planarize the second interlayer dielectric layer;
- selectively etching the first and second interlayer dielectric layers only up to a top surface of the pattern, thereby forming a contact hole for exposing the pattern;
- forming a barrier metal layer only on side surfaces of the first interlayer dielectric layer and on top and side surfaces of the second interlayer dielectric layer including the contact hole, wherein the barrier metal layer only partially covers the top surface of the pattern;
- forming a tungsten layer on the barrier metal layer including the contact hole by sequentially performing a first nucleation process, a second nucleation process, and a bulk deposition process, wherein the tungsten layer directly contacts the top surface of the pattern; and
- performing a chemical mechanical polishing process on the tungsten layer until the second interlayer dielectric layer is exposed.

9. The method as claimed in claim 8, wherein the first nucleation process is performed at a $WF_6:SiH_4$ ratio of 1:1, and the second nucleation process is performed at a $WF_6:SiH_4$ ratio of 2:1.

10. The method as claimed in claim 9, wherein the first nucleation process is performed for about 2 to 3 seconds to form the tungsten layer to have a thickness of about 80 Å or less.

11. The method as claimed in claim 9, wherein the second nucleation process is performed to form the tungsten layer to have a thickness in a range of about 300 to 500 Å.

12. The method as claimed in claim 8, wherein the bulk deposition process is performed by using $WF_6$, hydrogen gas, and argon gas.

13. A method of forming a metal interconnection, the method comprising the steps of:
- forming first and second interlayer dielectric layers on a substrate having a predetermined pattern;
- performing a chemical mechanical polishing process to planarize the second interlayer dielectric layer;
- selectively etching the first and second interlayer dielectric layers only up to a top surface of the pattern, thereby forming a contact hole for exposing the pattern;
- forming a slope by etching a corner of the contact hole;
- forming a barrier metal layer only on side surfaces of the first interlayer dielectric layer and on top and side surfaces of the second interlayer dielectric layer including the contact hole, wherein the barrier metal layer only partially covers the top surface of the pattern;
- plasma-treating the barrier metal layer with hydrogen and nitrogen gases for about 27 to 37 seconds;
- heat-treating the substrate in a nitrogen atmosphere;
- forming a tungsten layer on the barrier metal layer including the contact hole by sequentially performing a first nucleation process, a second nucleation process, and a bulk deposition process, wherein the tungsten layer directly contacts the top surface of the pattern; and
- performing a chemical mechanical polishing process on the tungsten layer until the second interlayer dielectric layer is exposed.

14. The method as claimed in claim 13, wherein the barrier metal layer has a dual layer structure including a titanium (Ti) layer and a nitride titanium (TiN) layer.

15. The method as claimed in claim 14, wherein the Ti layer is formed through an ionized metal plasma (IMP) process to have a thickness of about 250 Å or less.

16. The method as claimed in claim 13, wherein the slope is formed through an argon sputtering process using a radio frequency power.

17. The method as claimed in claim 13, wherein the heat-treating step includes a rapid thermal process (RTP) performed at a temperature of about 700° C. or above.

18. The method as claimed in claim 13, wherein the first nucleation process is performed at a $WF_6:SiH_4$ ratio of 1:1, and the second nucleation process is performed at a $WF_6:SiH_4$ ratio of 2:1.

19. The method as claimed in claim 18, wherein the first nucleation process is performed for about 2 to 3 seconds to form the tungsten layer to have a thickness of about 80 Å or less.

20. The method as claimed in claim 18, wherein the second nucleation process is performed to form the tungsten layer to have a thickness in a range of about 300 to 500 Å.

21. The method as claimed in claim 13, wherein the bulk deposition process is performed by using $WF_6$, hydrogen gas, and argon gas.

22. A method of forming a metal interconnection, the method comprising the steps of:
- forming an interlayer dielectric layer on a substrate having a predetermined pattern and another metal interconnection thereon;
- performing a chemical mechanical polishing process to planarize the interlayer dielectric layer;
- selectively etching the interlayer dielectric layer only up to a top surface of the another metal interconnection, thereby forming a via hole for exposing the another metal interconnection;
- forming a slope by etching a corner of the via hole;
- forming a barrier metal layer only on top and side surfaces of the interlayer dielectric layer including the via hole, wherein the barrier metal layer only partially covers the top surface of the another metal interconnection;
- plasma-treating the barrier metal layer with hydrogen and nitrogen gases for about 27 to 37 seconds;
- heat-treating the substrate in a nitrogen atmosphere;
- forming a tungsten layer on the barrier metal layer including the via hole by sequentially performing a first nucleation process, a second nucleation process, and a bulk deposition process, wherein the tungsten layer directly contacts the top surface of the another metal interconnection; and
- performing a chemical mechanical polishing process on the tungsten layer until the interlayer dielectric layer is exposed.

23. The method as claimed in claim 22, wherein the slope is formed through an argon sputtering process using a radio frequency power.

24. The method as claimed in claim 22, wherein the bulk deposition process is performed by using $WF_6$, hydrogen gas, and argon gas.

* * * * *